United States Patent
Woodruff et al.

[19]

[11] Patent Number: 6,063,690

[45] Date of Patent: May 16, 2000

[54] METHOD FOR MAKING RECESSED FIELD OXIDE FOR RADIATION HARDENED MICROELECTRONICS

[75] Inventors: Richard L. Woodruff, Fort Collins; David B. Kerwin; John T. Chaffee, both of Colorado Springs, all of Colo.

[73] Assignee: UTMC Microelectronics Systems Inc., Colorado Springs, Colo.

[21] Appl. No.: 08/999,476

[22] Filed: Dec. 29, 1997

[51] Int. Cl.[7] .................................................... H01L 21/76
[52] U.S. Cl. ............................................................ 438/426
[58] Field of Search ..................................... 438/426, 425, 438/400, 424, 429, 439, 443, 911

[56] References Cited

U.S. PATENT DOCUMENTS

| | | |
|---|---|---|
| 4,622,096 | 11/1986 | Dil et al. . |
| 4,721,687 | 1/1988 | Kakumu et al. . |
| 5,324,689 | 6/1994 | Yoo . |
| 5,543,343 | 8/1996 | Bryant et al. . |
| 5,554,560 | 9/1996 | Hsue et al. . |
| 5,567,645 | 10/1996 | Ahn et al. . |
| 5,686,346 | 11/1997 | Duanne ..................................... 438/439 |
| 5,930,648 | 7/1999 | Yang ........................................ 438/443 |

*Primary Examiner*—Charles Bowers
*Assistant Examiner*—Craig Thompson
*Attorney, Agent, or Firm*—Morgan&Finnegan, LLP

[57] ABSTRACT

A method of forming a recessed electrically-insulating field oxide region in a semiconductor substrate is disclosed. In a preferred embodiment, the method includes the steps of oxidizing a surface of the substrate; depositing a polysilicon layer over the oxide layer; depositing a silicon nitride layer over the polysilicon layer; patterning the silicon nitride and polysilicon layers and etching away both layers where the field oxide is to be located; forming a field oxide by thermally oxidizing the substrate in the openings previously formed in the silicon nitride and polysilicon layers; etching away the thermal field oxide; thermally oxidizing the substrate in the etched-away field oxide areas; etching away the silicon nitride layer; optionally, implanting through the thermal oxide with an impurity; depositing a doped oxide; densifying the oxide in a steam ambient; etching back the deposited oxide; then either depositing an undoped CVD oxide, coating the oxide with a leveling layer to planarize the oxide surface, etching both the undoped CVD oxide and leveling layers and etching away the polysilicon; or etching away the polysilicon, leaching the dopants out of the surface of the field oxide structure and passivating the surface in a dry oxygen ambient.

20 Claims, 2 Drawing Sheets

METHOD FOR MAKING RECESSED FIELD OXIDE FOR RADIATION HARDENED MICROELECTRONICS

TECHNICAL FIELD

This invention relates to integrated circuits ("ICs"), and more particularly to a method of forming an electrically-insulating field oxide region in a semiconductor substrate of an IC.

BACKGROUND ART

The trend in IC manufacturing over the years has been to increase the number of devices (e.g., bipolar or MOS transistors, capacitors, resistors) formed within a semiconductor substrate. This increase in device integration is made possible primarily by advances in material deposition techniques (e.g., the ionized cluster beam methodology), as well as in photolithographic and etching techniques. These advances have correspondingly decreased the area on a semiconductor substrate (e.g., silicon, germanium) taken up by the active devices and the electrically-isolating areas. However, as device sizes have shrunk, problems such as uneven topography (i.e., non-planar or irregular surfaces) and inaccurate alignment of device layers have arisen. These problems, in turn, have caused a number of manufacturing process and IC operational reliability concerns.

For example, it is well-known in the art to use a local oxidation of silicon ("LOCOS") approach to electrically isolate or insulate between the active areas of a device formed in the semiconductor substrate or between the individual devices in the substrate. The LOCOS process basically comprises the initial step of placing a pad oxide layer on the substrate surface areas where the active devices are to be formed. The pad oxide layer is then typically covered by a layer of silicon nitride. The silicon nitride and pad oxide layers act as a mask or barrier to the formation of the insulating field oxide over the active device areas of the semiconductor substrate. Field oxide formation results from the controlled oxidation of the silicon substrate by which a volume expansion occurs, wherein roughly one-half of the thickness of the field oxide region is above the substrate surface and the other one-half of the field oxide thickness is below the substrate surface.

However, a field oxide region selectively formed in a silicon substrate by the LOCOS process is not without its drawbacks. One problem is the undesired lateral encroachment or extension of the field oxide into the active device areas on the substrate underneath the mask layers. This is the well-known "bird's beak" phenomenon caused, in part, by the relatively large desired thickness of the field oxide region. To achieve such a thickness, an excessive amount of oxidation time is required. Thus, there is an inherent tradeoff between field oxide width and thickness. Also, besides encroaching upon and reducing the size of the active device areas on the substrate, the "bird's beak" phenomenon can result in regions of high stresses in the field oxide, especially adjacent the abutting nitride masks.

There are numerous known attempts in the prior art to alleviate the "bird's beak" phenomenon. One proposed solution has been to use an intermediate layer of polycrystalline silicon ("polysilicon") between the pad oxide and nitride layers. The polysilicon reportedly reduces oxidation-induced stacking faults resulting from the stress caused by the different thermal coefficients of expansion between the silicon semiconductor substrate and the silicon nitride layer. The polysilicon absorbs the excessive stress caused by the silicon nitride and prevents the lateral encroachment of oxidants. See U.S. Pat. No. 4,407,696. Other known attempts to solve the "bird's beak" phenomenon involve additional, complicated processing steps, such as adding, patterning and etching of the nitride and pad oxide layers as well as the field oxide regions.

Another problem with the LOCOS approach to forming the field oxide is the resulting non-planar or irregular topography of the semiconductor substrate surface. This causes problems, for example, in the patterning and etching of overlying conductive metallization layers. Known attempts to level or planarize the substrate surface at the field oxide have unduly complicated IC processing. For example, one known approach initially forms a trench in the silicon semiconductor substrate. The trench is then filled with a deposited or thermally-grown oxide. However, forming a trench with steep side walls and sharp corners, and then filling in the trench with oxide can lead to crystalline defects in the silicon substrate. Other known leveling approaches use a spin-on-glass as the leveling layer.

Further problems with the LOCOS approach to forming the field oxide include the inherent film-thinning effect. This effect results from the fact that the thickness of the field oxide layer is greater for relatively wider isolating regions formed on the silicon substrate, as opposed to relatively narrower isolating regions. An unduly thin field oxide layer may allow implanted ions to undesirably travel completely through the field oxide layer (i.e., the "punchthrough" effect). The thin field oxide layer also increases the capacitance between an overlying conductor and the underlying silicon substrate, thereby decreasing the speed of the semiconductor device. Thinner field oxide may also reduce the field inversion voltage causing leakage between adjacent active areas.

Other problems with the LOCOS approach include the formation of undesirable nitride "spots" or regions along the interface between the silicon substrate and oxide region. Normal removal or prevention of these spots involves additional, complex manufacturing steps. Generally, any time the number of IC processing steps is increased, a higher probability occurs of creating defects in the IC. This lowers the effective yield and reliability of the ICs.

Problems of a different nature with the LOCOS approach arise when the IC is exposed to ionizing radiation, such as in a space or nuclear environment. Ionizing radiation can generate electron/hole pairs. When generated in the silicon substrate, these pairs tend to recombine rapidly, which normally is not a problem for IC device operation. However, electron/hole pairs formed in an oxide region are more problematic. This is because, in oxide, electrons are relatively more mobile than holes. The electrons may become separated from the holes, making recombination difficult, and resulting in a parasitic leakage current due to early onset of field inversion facilitated by hole trapping.

This radiation-induced, parasitic leakage current may be categorized as either device-to-device or drain-to-source leakage. Device-to-device leakage current is due to positive trapped charge in the field oxide, which causes an inversion of the P-type doped silicon separating the N-type doped source and drain regions of two N-channel transistors. On the other hand, drain-to-source leakage current results from inversion of the P-type doped silicon along the field oxide edge of a single transistor formed in the semiconductor substrate.

In an attempt to alleviate these leakage currents, it is known to implant the field oxide region, either before or after its formation, with a boron impurity. The amount of implanted dopant is calculated to prevent the formation of parasitic transistors. However, with the traditional LOCOS field oxide dopant implant process, a dopant depletion exists at the interface and extending down into the semiconductor substrate. Ideally, there is a higher impurity concentration at the substrate surface. Also, the total dose radiation hardening characteristics of LOCOS field oxide are relatively poor.

Known attempts to more uniformly deposit a planar oxide, instead of a localized field oxide, have introduced an additional problem with the resulting oxide topography. More specifically, the resulting steep vertical oxide sidewalls make subsequent processing of the multi-level interconnect metallization difficult.

DISCLOSURE OF INVENTION

Objects of the present invention include the significant reduction or elimination of a parasitic leakage current in MOS transistors formed in a semiconductor substrate exposed to ionizing radiation. Other objects include a method for device isolation in ICs to facilitate the ultra miniaturization and high density integration of circuit elements on a semiconductor substrate, and to reduce or eliminate problems with step coverage and crystalline defects. Yet other objects include the reduction or elimination of the "bird's beak" phenomenon.

According to the invention, the method comprises the steps of oxidizing a surface of a silicon semiconductor substrate; depositing a polysilicon layer over the oxide layer; depositing a silicon nitride layer over the polysilicon layer; patterning the silicon nitride and polysilicon layers by etching away both layers where the field oxide is to be located; forming a field oxide by thermally oxidizing the silicon substrate in the openings previously formed in the silicon nitride and polysilicon layers; etching away the thermal field oxide; thermally oxidizing the silicon substrate in the etched-away field oxide areas; etching away the silicon nitride mask layer; optionally, implanting through the thermal oxide with an impurity; depositing a doped oxide; densifying the film in a steam ambient; etching back the deposited oxide; then either depositing an undoped CVD oxide, coating the resulting wafer with a leveling layer of spin-on-glass to planarize the wafer surface, etching both the undoped CVD oxide and leveling layers and etching away the polysilicon; or etching away the polysilicon, leaching the dopants out of the surface of the field oxide structure and passivating the surface in a dry oxygen ambient.

The above and other objects and advantages of this invention will become more readily apparent when the following description is read in conjunction with the accompanying drawings.

BEST MODE FOR CARRYING OUT THE INVENTION

Figure 1:
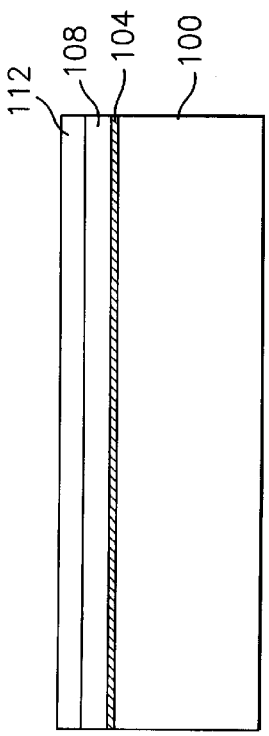

FIG. 1 illustrates a bulk silicon semiconductor substrate 100 that may be doped either P-type or N-type, as is conventional in the art. A top surface of the silicon substrate 100 is thermally oxidized to form a pad oxide layer 104 with a thickness from approximately 5 nanometers to 80 nanometers. On the top surface of the pad oxide layer 104 is deposited a polysilicon layer 108 with a thickness from approximately 15 nanometers to 400 nanometers. On the top surface of the polysilicon layer 108 is deposited a silicon nitride layer 112 with a thickness from approximately 15 nanometers to 400 nanometers. As discussed above, the intermediate polysilicon layer 108 between the pad oxide layer 104 and the silicon nitride layer 112 reportedly absorbs excess stress caused by the silicon nitride and prevents lateral encroachment of oxidants into active device areas on the substrate 100.

Figure 2:
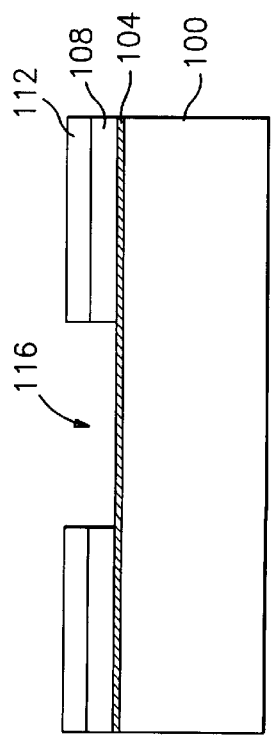

FIG. 2 illustrates both the silicon nitride layer 112 and the polysilicon layer 108 being selectively patterned and etched to remove these two layers from the surface of the pad oxide layer 104 at a defined region 116. This region 116, defined by the removal of the silicon nitride and polysilicon layers, defines an area on the substrate 100 where the field oxide is ultimately located.

Figure 4:
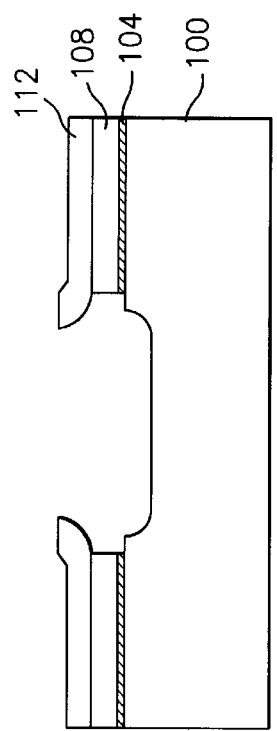
FIGS. 1–10 are cross-sectional diagrams illustrating a silicon semiconductor substrate after various sequential processing steps in forming a field oxide region in the substrate in accordance with the method of the present invention.
Figure 3:
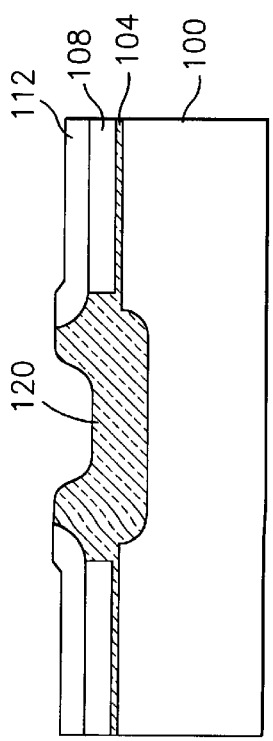

FIG. 3 illustrates the silicon substrate 100 after the field oxide region 116 has been thermally oxidized to form a first oxide area 120. Such oxidation preferably takes place in an ambient containing dry oxygen or steam at a pressure ranging from approximately 0.1 atmospheres to 30 atmospheres, and at a temperature ranging from approximately 750 degrees C. to 1100 degrees C. The resulting thickness of the oxide area 120 formed by the thermal oxidation process preferably ranges from approximately 200 nanometers to 1200 nanometers. FIG. 4 illustrates the silicon substrate 100 after the first oxide area 120 has been removed by etching.

Figure 5:
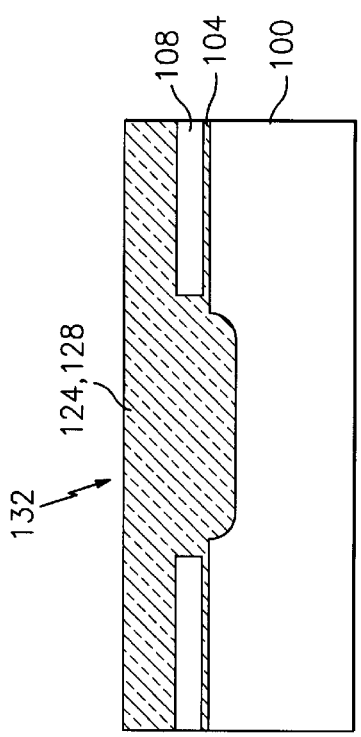

FIG. 5 illustrates the silicon substrate 100 after a second thermal oxidation step has formed a second oxide area 124 with the thickness ranging from approximately 5 nanometers to 45 nanometers. FIG. 5 also illustrates the substrate 100 after the removal by etching of the silicon nitride layer 112.

At this point, an optional step may be performed where a region of the silicon substrate 100 underlying the second thermal oxide layer 124 may be implanted with a moderate dose of an impurity such as boron or a boron-containing species such as boron trifluoride, to a dose ranging from approximately $10^{11}$ to $10^{16}$ ions per square centimeter at an energy ranging from approximately 15 keV to 60 keV. The boron is implanted into the underlying silicon substrate 100 down through the thermal oxide 124. To insure the active regions of the silicon are not implanted with boron, the upper surface of the silicon substrate 100 is masked off with a photoresist (not shown). Subsequent to boron implantation, the photoresist is removed.

Still referring to FIG. 5, a third layer of oxide 128 is formed by chemical vapor deposition ("CVD"). The third oxide layer 128 is formed over the second oxide layer 124 such that both layers 124,128 form one contiguous oxide layer 132. The CVD oxide layer 128 preferably has a thickness greater than about one-half of the minimum lateral field dimension of the region 116 after the removal of silicon nitride layer 112 and polysilicon layer 108 illustrated in FIG. 2. Preferably, the oxide layer 128 deposited by the CVD method contains phosphorous and/or boron dopants, each dopant having a preferable exemplary concentration ranging from approximately 0% to 8% by weight. The resulting oxide layer 132 is then densified in a steam ambient with a pressure ranging from approximately 0.1 atmospheres to 30 atmospheres and at a temperature range of approximately 750 degrees C. to 1100 degrees C.

Figure 6:
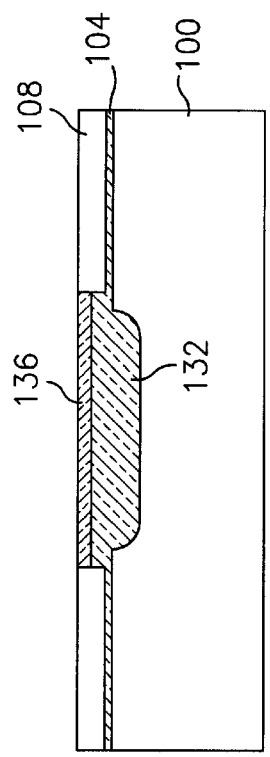

FIG. 6 illustrates the silicon substrate 100 after the contiguous oxide layer 132 has been etched back, preferably using the polysilicon layer 108 as an etch stop, with a controlled over-etch ranging from approximately 0 nanometers to 400 nanometers.

Figure 7:
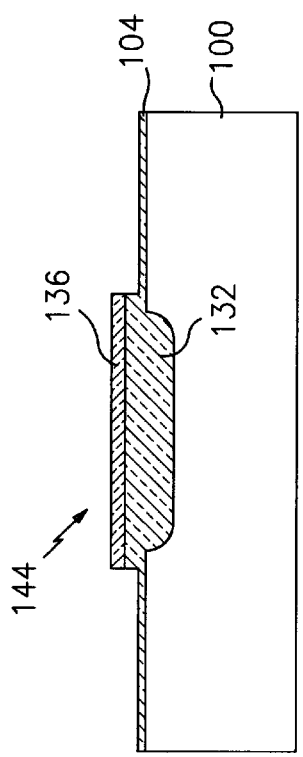

At this point, the method of the present invention can follow one of two paths. In a first exemplary embodiment, the process continues, as illustrated in FIG. 7, by depositing an undoped CVD oxide layer 136 onto the oxide layer 132. The undoped CVD oxide layer 136, which represents a fourth oxide layer formed as part of the method of the present invention, preferably has a thickness greater than or equal to the controlled over-etch of FIG. 6, which ranges from approximately 0 nanometers to 400 nanometers. The upper surface of the undoped CVD oxide layer 136 then has a leveling layer 140 of preferably a photoresist or a spin-on-glass deposited thereon. The leveling layer 140 preferably has a thickness ranging from approximately 100 nanometers to 2000 nanometers. The spin-on-glass may be either a silicate based or a siloxane based material. The spin-on-glass leveling layer 140, which is deposited using conventional techniques, fills in any indentations and, thereby, planarizes or smooths the upper surface of the undoped CVD oxide layer 136.

Figure 8:
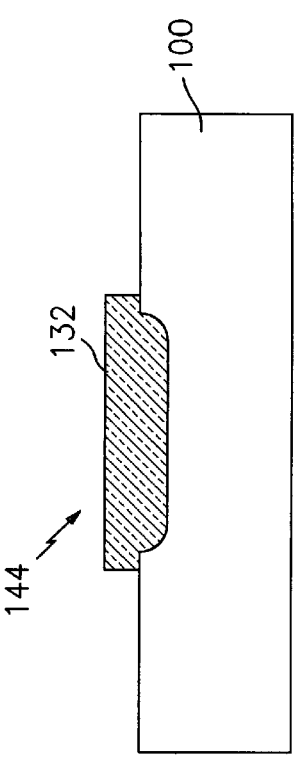

FIG. 8 illustrates the silicon substrate 100 after both the undoped CVD oxide layer 136 and the leveling layer 140 have been etched back using the polysilicon layer 140 as an etch stop. Preferably, the etch rates of both the undoped CVD oxide layer 136 and the leveling layer 140 are approximately the same.

Figure 9:
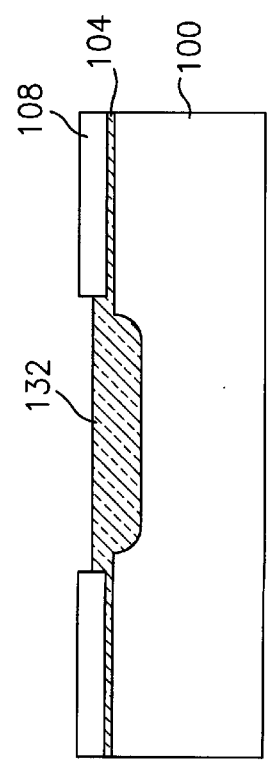

FIG. 9 illustrates the remaining field oxide structure 144, resulting from the method of the present invention, after the polysilicon layer 108 has been removed by etching. As can be seen in FIG. 9, the sidewalls of the resulting field oxide region 144 are somewhat rounded instead of steep, but abrupt enough to avoid radiation induced leakage along the field edge of an n-channel transistor. The resulting topography of the field oxide region 144 is relatively less severe than a field oxide region formed by a prior-art multi-layer field oxide technique. As such, the field oxide region 144 of the present invention provides for improved manufacturability of subsequent processing of multi-level interconnect metallization layers (not shown).

Figure 10:
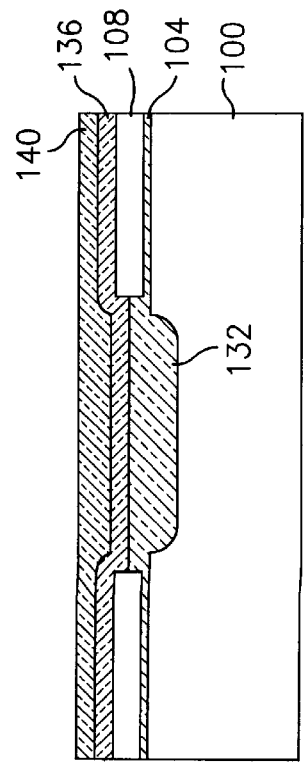

Once the process or method of the present invention has reached the step illustrated in FIG. 6, the second alternative embodiment of the present invention is illustrated in FIG. 10. The polysilicon layer 108 has been removed by etching, and a step is performed which leaches the dopants out from the surface of the oxide layer 132. This leaching step is preferably performed in a steam ambient with a pressure ranging from approximately 0.1 atmospheres to 30 atmospheres, and at a temperature range from approximately 750 degrees C. to 1100 degrees C. Finally, the surface of the oxide layer 132 is passivated in a dry oxygen ambient with a pressure ranging from about 0.1 atmospheres to 30 atmospheres, at a temperature ranging from approximately 750 degrees C. to 1100 degrees C. The resulting field oxide region 144 is similar to the field oxide structure 144 of FIG. 9.

It should be understood by those skilled in the art that obvious structural modifications can be made, in light of the teachings herein, without departing from the scope of the present invention. Accordingly, reference should be made primarily to the accompanying claims, rather than the foregoing specification, to determine the scope of the invention.

Having thus described the invention, what is claimed:

1. A method of manufacturing an electrically-insulating field oxide region in a semiconductor substrate, comprising:

forming a pad oxide layer on a surface of the substrate;

depositing a layer of polysilicon on a surface of the pad oxide layer;

depositing a silicon nitride layer on a surface of the polysilicon layer;

removing a portion of the silicon nitride layer and a portion of the polysilicon layer over a portion of the substrate;

forming a first field oxide layer at the portion of the substrate where the silicone nitride layer and the polysilicon layer were removed;

removing the first field oxide layer from the portion of the substrate;

forming a second field oxide layer at the portion of the substrate where the first field oxide layer was removed;

removing the silicone nitride layer;

forming a third field oxide layer on the surface of the second field oxide layer; and removing part of the third field oxide layer.

2. The method of claim 1, further comprising, after the step of etching the third field oxide layer:

forming a fourth field oxide layer on a surface of the third field oxide layer;

forming a leveling layer of a selected material on a surface of the fourth field oxide layer;

removing the fourth field oxide layer and the leveling layer; and removing the polysilicon layer.

3. The method of claim 1, further comprising, after the step of partially removing the third field oxide layer:

removing the polysilicon layer;

leaching any dopants out of any remaining ones of the second, third and fourth field oxide layers, wherein any of the remaining ones of the second, third and fourth field oxide layers combine to form the electrically-insulating field oxide region in the semiconductor substrate; and passivating a surface of the electrically-insulating field oxide region in the semiconductor substrate.

4. The method of claim 1, further comprising, after the step of forming a first field oxide layer:

forming a masking layer on at least a portion of the remaining surface of the silicon nitride layer;

implanting a selected material down through a surface of the first field oxide layer and into the substrate; and removing the masking layer.

5. The method of claim 1, wherein the step of forming the pad oxide layer comprises thermally oxidizing the substrate to between 5 nanometers and 80 nanometers.

6. The method of claim 1, comprising depositing the layer of polysilicon to a thickness of between 15 nanometers and 400 nanometers.

7. The method of claim 1, comprising depositing the silicone nitride layer to a thickness of between 15 nanometers and 400 nanometers.

8. The method of claim 1, comprising forming the first field oxide layer with a thickness of from 200 nanometers to 1200 nanometers by thermally oxidizing the substrate in an ambient containing at least one of the elements from the group consisting essentially of dry oxygen and steam, at a partial pressure from 0.1 atmospheres to 30 atmospheres, and at a temperature from 750 degrees C. to 100 degrees C.

9. The method of claim 1, comprising forming the second field oxide layer with a thickness of from 5 nanometers to 45 nanometers.

10. The method of claim 4, wherein the step of forming the masking layer comprises locating a photoresist on at least a portion of the remaining surface of the silicon nitride layer.

11. The method of claim 4, wherein the step of implanting the selected material down through the surface of the first field oxide layer and into the substrate comprises implanting the selected material which at least partially comprises boron at a dose ranging from $10^{11}$ to $10^{16}$ ions per square centimeter and with an energy range from 15 keV to 60 keV.

12. The method of claim 1, wherein the step of forming the third field oxide layer comprises chemical vapor deposition of oxide, wherein the third field oxide layer has a thickness that is greater than at least one-half of the lateral dimension of the portion of the substrate wherein the portions of the silicon nitride layer and the polysilicon layer were removed, wherein the oxide contains a substance from the group consisting essentially of phosphorous and boron, and a concentration of the substance within the oxide is in the range of from 0% to 8% by weight.

13. The method of claim 12, further comprising densifying the third field oxide layer in a steam ambient with a partial pressure ranging from 0.1 atmospheres to 30 atmospheres and with a temperature ranging from 750 degrees C. to 1100 degrees C.

14. The method of claim 1, wherein the step of removing the third field oxide layer comprises etching back the third field oxide layer utilizing the polysilicon layer as an etch stop with a controlled over-etch ranging from 0 nanometers to 400 nanometers.

15. The method of claim 2, wherein the step of removing the third field oxide layer comprises etching back the third field oxide layer utilizing the polysilicon layer as an etch stop with a controlled over-etch ranging from 0 nanometers to 400 nanometers, and the step of forming the fourth field oxide layer comprises depositing an undoped oxide layer through chemical vapor deposition, wherein the thickness of the undoped oxide layer is at least equal to the range of from 0 nanometers to 400 nanometers for the controlled over-etch.

16. The method of claim 2, wherein the step of forming the leveling layer comprises coating the surface of the fourth field oxide layer with the selected material selected from the group consisting essentially of photoresist and spin-on-glass, wherein a predetermined thickness of the leveling layer ranges from 100 nanometers to 2000 nanometers.

17. The method of claim 2, wherein the step of removing the fourth field oxide layer and the leveling layer comprises etching back the fourth field oxide layer and the leveling layer at the same rate of removal, wherein the polysilicon layer is utilized as an etch stop.

18. The method of claim 3, wherein the step of removing the polysilicon layer comprises etching off the polysilicon layer.

19. The method of claim 3, wherein the step of leaching dopants out of any remaining ones of the second, third and fourth field oxide layers is carried out in a steam ambient with a partial pressure ranging from 0.1 atmospheres to 30 atmospheres and with a temperature ranging from 750 degrees C. to 1100 degrees C.

20. The method of claim 13, wherein the step of passivating the surface of the electrically-insulating field oxide region in the semiconductor substrate is carried out in a dry oxygen ambient with a partial pressure ranging from 0.1 atmospheres to 30 atmospheres and with a temperature ranging from 750 degrees C. to 1100 degrees C.

* * * * *